United States Patent
Herbeck et al.

(10) Patent No.: US 9,490,821 B2
(45) Date of Patent: Nov. 8, 2016

(54) GLITCH LESS DELAY CIRCUIT FOR REAL-TIME DELAY ADJUSTMENTS

(71) Applicant: Apple Inc., Cupertino, CA (US)

(72) Inventors: Gilbert H. Herbeck, Livermore, CA (US); Gregoire J. Le Grand de Mercey, San Francisco, CA (US); Yair R. Koren, Sunnyvale, CA (US); Jung Wan Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 40 days.

(21) Appl. No.: 14/497,376

(22) Filed: Sep. 26, 2014

(65) Prior Publication Data
US 2016/0094230 A1  Mar. 31, 2016

(51) Int. Cl.
*H03L 7/06* (2006.01)
*H03L 7/081* (2006.01)
*H03K 5/01* (2006.01)

(52) U.S. Cl.
CPC .............. *H03L 7/0818* (2013.01); *H03K 5/01* (2013.01); *H03L 7/0814* (2013.01)

(58) Field of Classification Search
CPC .................................................. H03L 7/0818
See application file for complete search history.

(56) References Cited

U.S. PATENT DOCUMENTS

| | | | |
|---|---|---|---|
| 6,674,314 B2 | 1/2004 | Takai | |
| 6,742,133 B2 | 5/2004 | Saeki | |
| 7,071,746 B2 | 7/2006 | Suda et al. | |
| 7,301,830 B2 | 11/2007 | Takahashi | |
| 2004/0125905 A1* | 7/2004 | Vlasenko | H03L 7/0814 375/376 |

* cited by examiner

*Primary Examiner* — Daniel Puentes
(74) *Attorney, Agent, or Firm* — Meyertons, Hood, Kivlin, Kowert & Goetzel, P.C.

(57) ABSTRACT

An apparatus is disclosed in which a clock signal may propagate through a delay circuit. The delay circuit may include a first and a second delay stage, in which each delay stage may be programmable for one of two delay times, depending on a value of a respective control signal to each delay stage. The delay circuit may also include circuitry which may change the value of the respective control signal from a first value to a second value. The circuitry may change the value of the respective control signal responsive to a determination that an output of the first stage and an output of the second stage are equal.

18 Claims, 6 Drawing Sheets

US 9,490,821 B2

GLITCH LESS DELAY CIRCUIT FOR REAL-TIME DELAY ADJUSTMENTS

BACKGROUND

1. Technical Field

Embodiments described herein are related to the field of integrated circuit implementation, and more particularly to the implementation of variable delay circuits.

2. Description of the Related Art

Computing systems may include one or more systems-on-a-chip (SoCs), which may integrate a number of different functions, such as, application execution, graphics processing and audio processing, onto a single integrated circuit. With numerous functions included in a single integrated circuit, chip count may be kept low in mobile computing systems, such as tablets, for example, which may result in reduced assembly costs, and a smaller form factor for such mobile computing systems.

SoC designs may include various signals travelling through a variety of circuits. As signals travel through a number of circuits and buffers, propagation delays may cause a transition of a signal to occur at different points in time through the variety of circuits. Under some conditions, a given signal may need to be delayed for a period of time to align its signal transitions with one or more other signals that may have encountered more propagation delays than the given signal. Assorted designs of a delay circuit may be used to accomplish this alignment. In some designs, a delay circuit may also be utilized to adjust timing of a clock circuit. For example, a delay circuit may be used in a feedback loop of a ring oscillator to help set a period of the oscillator.

Many delay circuits are designed for a fixed delay time, i.e., the delay time cannot be adjusted by hardware or software in the SoC. In such cases, a chip designer may add a delay circuit to a signal depending on results of a timing analysis of the chip. The delay time of a fixed delay circuit may vary with manufacturing process variations, supply voltage changes, and/or operating temperature changes, referred to herein as process, voltage, and temperature (PVT) changes.

In some designs, a delay circuit may be designed such that the delay time is adjustable. Such variable delay circuits may, however, be susceptible to adding glitches to the signal being delayed when the delay time is adjusted. To prevent glitches from occurring on the signal being delayed, adjustments may be limited to when the signal is inactive.

SUMMARY OF THE EMBODIMENTS

Various embodiments of a delay circuit are disclosed. Broadly speaking, a system, an apparatus, and a method are contemplated in which the apparatus includes a first delay unit, a second delay unit, and circuitry. The first delay unit may be configured to delay propagation of a signal by a first delay time responsive to a first value of a first control signal, and to delay propagation of the signal by a second delay time responsive to a second value of the first control signal. The second delay unit may be configured to delay propagation of an output of the first delay unit by a third delay time responsive to a first value of a second control signal, and to delay propagation of the output of the first delay unit by a fourth delay time responsive to a second value of the second control signal. The circuitry may be configured to change the first control signal from the second value to the first value responsive to a determination that the output of the first delay unit and an output of the second delay unit are both a same logic value.

In a further embodiment, the signal may be a clock signal. In a still further embodiment, the circuitry may be further configured to change the first control signal from the second value to the first value while the clock signal is active. In one embodiment, the circuitry may be further configured to change the first control signal from the second value to the first value responsive to a transition of the clock signal.

In another embodiment, a value of the first delay time may be less than a value of the second delay time. In an embodiment, a value of the first delay time may be substantially the same as a value of the third delay time. In one embodiment, the output of the second delay path may remain at a constant logic value when the first value of the first control signal is selected.

BRIEF DESCRIPTION OF THE DRAWINGS

The following detailed description makes reference to the accompanying drawings, which are now briefly described.

Figure 1:
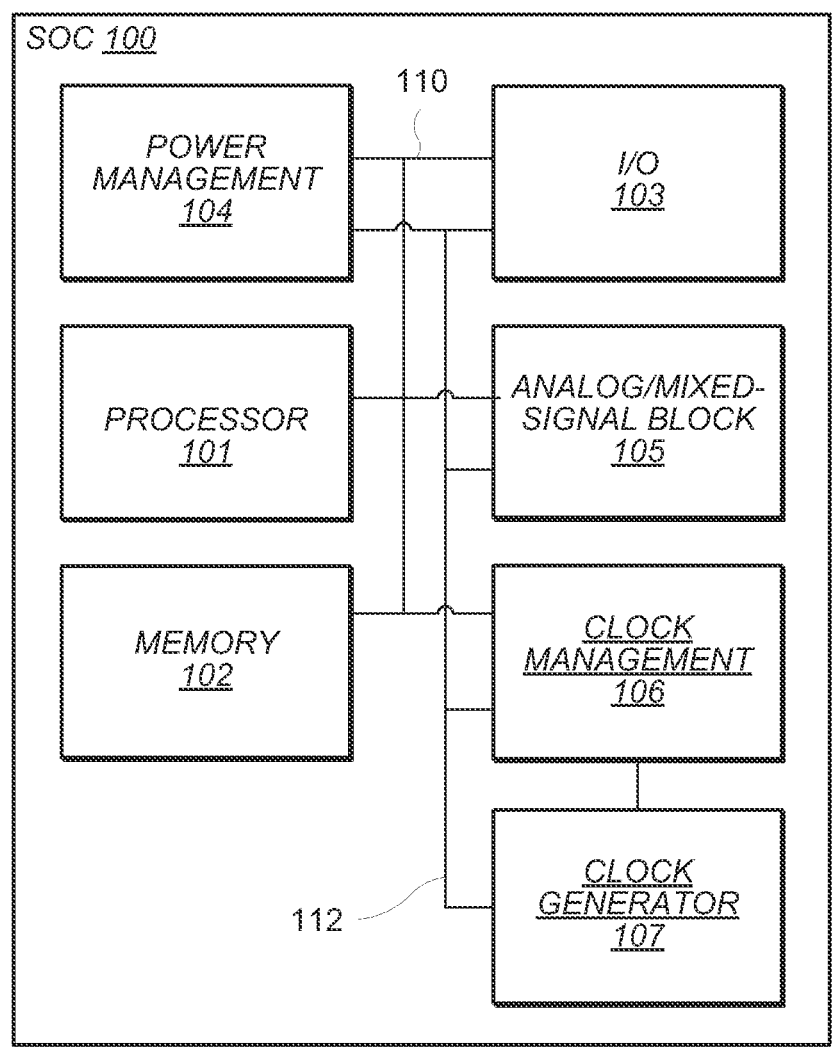
FIG. 1 illustrates an embodiment of a system-on-a-chip (SoC).

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A system on a chip (SoC) may include one or more functional blocks, such as, e.g., a processor and one or more memories, which may integrate the function of a computing system onto a single integrated circuit. SoC designs may include various signals travelling through a variety of circuits. Propagation delays through these circuits may cause transitions of a signal to occur at different points in time throughout the various circuits. To align signal transitions within a given circuit, one or more signals received by the given circuit may need to be delayed for a period of time relative to other signals that may have encountered more propagation delays. Alignment of signal transitions may be accomplished by a variety of a delay circuit designs. In some embodiments, a delay circuit may also be utilized to adjust timing of a clock circuit. For example, a delay circuit may be used in a feedback loop of a ring oscillator to help set a period of the oscillator.

In some embodiments, a delay circuit may be designed for a fixed delay time, i.e., the delay time cannot be adjusted by hardware or software in the SoC. Although referred to as a "fixed" delay, the delay time of a fixed delay circuit may vary with process, voltage, and temperature (PVT) changes. In some designs, a delay circuit may be designed such that the propagation delay time is adjustable. Such variable delay circuits may, however, be susceptible to glitching the signal being delayed when the delay time is adjusted. As used herein, "glitching" refers to adding an unintended and unwanted transition (i.e., a "glitch") to a signal line. Adjustments to a delay time in such circuits may be limited to times when the signal is inactive in order to prevent glitches from occurring or to limit an occurrence of a glitch to times when the signal is not being used.

The embodiments illustrated in the drawings and described below may provide a solution for delaying propagation of transitions of a signal. These embodiments may also provide techniques that may allow for a delay time to be adjusted while the signal is in active use, without introducing an unwanted glitch on the signal.

Many terms commonly used in reference to SoC designs are used in this disclosure. For the sake of clarity, the intended definitions of some of these terms, unless stated otherwise, are as follows.

A Metal-Oxide-Semiconductor Field-Effect Transistor (MOSFET) describes a type of transistor that may be used in modern digital logic designs. MOSFETs are designed as one of two basic types, n-channel and p-channel. Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

System-on-a-Chip Overview

A block diagram of an embodiment of an SoC is illustrated in FIG. 1. In the illustrated embodiment, the SoC 100 includes a processor 101 coupled to memory block 102, I/O block 103, power management unit 104, analog/mixed-signal block 105, clock management unit 106, all coupled through bus 110. Additionally, clock generator 107 may be coupled to clock management unit 106 and provide a clock signal 112 to some blocks in SoC 100, such as I/O block 103, power management unit 104, analog/mixed-signal block 105, and clock management unit 106. In various embodiments, SoC 100 may be configured for use in a mobile computing application such as, e.g., a tablet computer or smartphone.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores and may include one or more register files and memories.

In various embodiments, processor 101 may implement any suitable instruction set architecture (ISA), such as, e.g., PowerPC™, or x86 ISAs, or combination thereof. Processor 101 may include one or more bus transceiver units that allow processor 101 to communication to other functional blocks within SoC 100 such as, memory block 102, for example.

Memory block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as memory block 102 and other embodiments may include more than two memory blocks (not shown). In some embodiments, memory block 102 may be configured to store program instructions that may be executed by processor 101. Memory block 102 may, in other embodiments, be configured to store data to be processed, such as graphics data, for example. Memory block 102, may, in some embodiments, include a memory controller for interfacing to memory external to SoC 100, such as, for example, one or more DRAM chips.

I/O block 103 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 103 may be configured to implement a version of Universal Serial Bus (USB) protocol, IEEE 1394 (Firewire®) protocol, or, and may allow for program code and/or program instructions to be transferred from a peripheral storage device for execution by processor 101. In one embodiment, I/O block 103 may be configured to perform the data processing necessary to implement an Ethernet (IEEE 802.3) networking standard.

Power management unit 104 may be configured to manage power delivery to some or all of the functional blocks included in SoC 100. Power management unit 104 may comprise sub-blocks for managing multiple power supplies for various functional blocks. In various embodiments, the power supplies may be located in analog/mixed-signal block 105, in power management unit 104, in other blocks within SoC 100, or come from external to SoC 100, coupled through power supply pins. Power management unit 104 may include one or more voltage regulators to adjust outputs of the power supplies to various voltage levels as required by functional blocks within SoC 100.

Analog/mixed-signal block 105 may include a variety of circuits including, for example, a crystal oscillator, an internal oscillator, a phase-locked loop (PLL) or frequency-locked loop (FLL), an analog-to-digital converter (ADC), and a digital-to-analog converter (DAC) (all not shown). In some embodiments, analog/mixed-signal block 105 may also include, in some embodiments, radio frequency (RF) circuits that may be configured for operation with cellular telephone networks. Analog/mixed-signal block 105 may include one or more voltage regulators to supply one or more voltages to various functional blocks and circuits within those blocks.

Clock management unit 106 may be configured to enable, configure and manage outputs of one or more clock sources. In various embodiments, the clock sources may be located in analog/mixed-signal block 105, in clock management unit 106, in other blocks with SoC 100, or come from external to SoC 100, coupled through one or more I/O pins. In some embodiments, clock management unit 106 may be capable of dividing a selected clock source before it is distributed throughout SoC 100. Clock management unit 106 may include registers for selecting an output frequency of a PLL, FLL, or other type of adjustable clock source.

Clock generator 107 may be a sub-module of analog/mixed signal block 105 or clock management unit 106. In other embodiments, clock generator 107 may be a separate module within SoC 100. One or more clock sources may be included in clock generator 107. In some embodiments, clock generator 107 may include PLLs, FLLs, internal oscillators, oscillator circuits for external crystals, etc. One or more clock signal outputs 112 may provide clock signals to various functional blocks of SoC 100.

System bus 110 may be configured as one or more buses to couple processor 101 to the other functional blocks within the SoC 100 such as, e.g., memory block 102, and I/O block 103. In some embodiments, system bus 110 may include interfaces coupled to one or more of the functional blocks that allow a particular functional block to communicate through the bus. In some embodiments, system bus 110 may allow movement of data and transactions (i.e., requests and responses) between functional blocks without intervention from processor 101. For example, data received through the I/O block 103 may be stored directly to memory block 102.

It is noted that the SoC illustrated in FIG. 1 is merely an example. In other embodiments, different functional blocks and different configurations of functions blocks may be possible dependent upon the specific application for which the SoC is intended.

Figure 2:
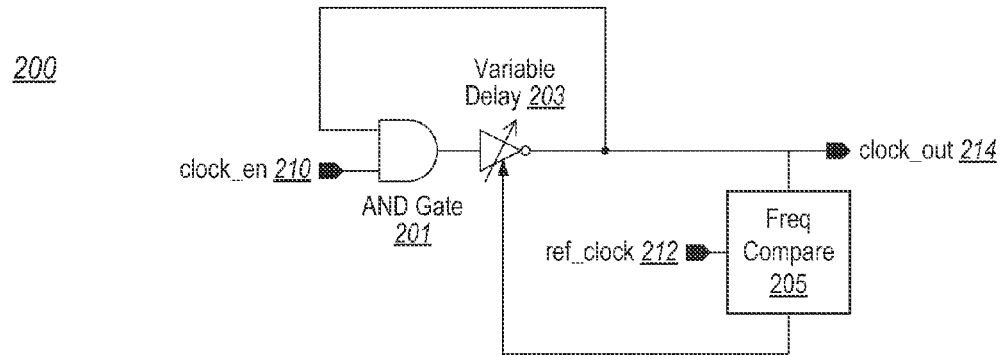
FIG. 2 illustrates a block diagram of a ring oscillator.

Turning to FIG. 2, an embodiment of a block diagram of a ring oscillator is illustrated. Oscillator 200 may represent a component or sub-component within an SoC, such as SoC 100, for example. Oscillator 200 may include AND gate 201 coupled to variable delay circuit 203, and frequency compare unit 205. Oscillator 200 may receive clock enable signal (clock_en) 210 and reference clock signal (ref_clock) 212, and may generate clock output (clock_out) 214.

In some embodiments, oscillator 200 may be capable of generating a clock output for use by one or more functional blocks of SoC 100 without requiring any external components such as a crystal, capacitor, or resistor. If clock_en 210 is low, then the output of AND gate 201 may also be low, regardless of the output of variable delay circuit 203. In other words, oscillator 200 may be disabled by driving clock_en 210 low. A functional block, such as, for example, processor 101, may enable oscillator 200 by driving clock_en 210 high, at which point, the output of AND gate 201 may be high if the output of variable delay circuit 203 (clock_out 214) is high and low if clock_out 214 is low.

Variable delay circuit 203 may output a value that is the inverse of its input value. Variable delay circuit 203 may also delay transitioning clock_out 214 for a selected time period from when the input value transitions. The time period may be selectable dependent upon a value received from frequency compare unit 205. Since variable delay circuit 203 inverts the input to generate clock_out 214 and clock_out 214 is fed back to the input through AND gate 201, clock_out 214 will oscillate as long as clock_en 210 is high. The period of clock_out 214 may be dependent on the total delay time through variable delay circuit as well as any additional delay through AND gate 201. In some embodiments, the delay through variable delay circuit 203 may be large enough that the delay through AND gate 201 is small enough in comparison to be ignored.

To improve accuracy and/or adjust the frequency of clock_out 214, frequency compare unit 205 may compare clock_out 214 to received ref_clock 212. Frequency compare unit 205 may determine if the frequency of clock_out 214 is the same frequency as a predetermined integer multiple of the frequency of ref_clock 212. In some embodiments, the integer multiple of frequency compare unit 205 may be programmable in order to allow setting of the frequency of clock_out 214 to various multiples of ref_clock 212. Frequency compare unit 205 may compare the frequency of clock_out 214 to a predetermined integer multiple of the frequency of ref_clock 212, and then determine if the frequency of clock_out 214 needs to be increased, decreased, or left as is. If the frequency of clock_out 214 needs to be increased or decreased, frequency compare unit 205 may determine a new delay value to send to variable delay circuit 203. The new delay value may adjust the period of clock_out 214 to achieve the desired frequency.

It is noted that the embodiment of oscillator 200 as illustrated in FIG. 2 is merely an example. The illustration of FIG. 2 has been simplified to highlight features relevant to this disclosure. Various embodiments may include any number and types of functional blocks. In addition, in some embodiments, frequency compare unit 205 may be enabled temporarily to adjust the frequency of clock_out 214 and then disabled to conserve power. It is also noted that while an integer multiple of the frequency of ref_clock 212 is described, frequency compare units that support non-integer multiples of a reference clock are known and contemplated for use in other embodiments of oscillator 200.

It is also noted that a "clock transition," as used herein (which may also be referred to as a "clock edge" in some embodiments) may refer to a clock signal changing from a first logic value to a second logic value. A clock transition may be "rising" if the clock signal goes from a low value to a high value, and "falling" if the clock signal goes from a high to a low.

Figure 3:
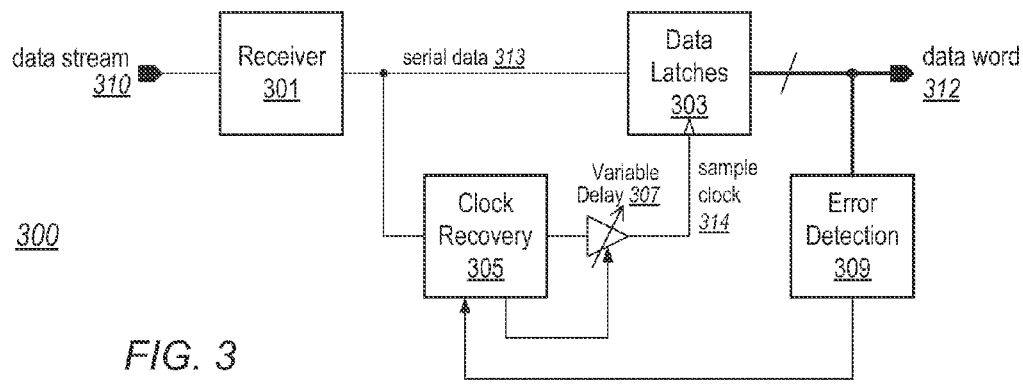
FIG. 3 illustrates a block diagram of a data deserializer.

Moving to FIG. 3, a block diagram of a data deserializer is presented. Data deserializer 300 may also represent a component or sub-component within an SoC, such as SoC 100, for example. Data deserializer 300 may include receiver 301, coupled to data latches 303 and clock recovery 305. In addition, error detection unit 309 may be coupled to the output of data latches 303 and to clock recovery 305. Data deserializer 300 may receive data stream 310 over a communications channel and output data word 312.

Data deserializer may be used to receive a serial data stream and convert the serial data into data words usable by various components of SoC 100. Data stream 310 may be received from any suitable wired (e.g., USB, Firewire) or wireless (e.g., Bluetooth, Wi-Fi) communications link. A compatible receiver 301 may receive data stream 310 and output a corresponding serial data 313 to data latches 303 and clock recovery 305. Data latches 303 may require sample clock 314 in order to capture and latch each data bit while the data bit value is valid in serial data 313. Clock recovery 305 may be used to generate a sample clock dependent on transitions of serial data 313. In some embodiments, a synchronization or link training step may be performed when the communications link is established, during which time, clock recovery 305 may adjust a sample clock signal to meet the requirements for the communications link.

Variable delay circuit 307 may be used to adjust sample clock 314 such that transitions of sample clock 314 correspond to data valid times of serial data 313. In some embodiments, variable delay circuit 307 may be included in clock recovery 305, and in such embodiments, may be a part of a delay-locked loop (DLL) circuit. A bit rate of data stream 310 may drift to a higher or lower frequency over time. Error detection unit 309 may monitor a data error rate of data words 312 output from data latches 303. This data error rate may be sent to clock recovery 305. To compensate for an increase in the data error rate, variable delay circuit 307 may be adjusted during reception of serial data 313 by circuitry in clock recovery 305 to reduce the data error rate.

It is noted that FIG. 3 is merely an example of a data deserializer in an SoC. The illustrated embodiment is simplified for purposes of demonstrating the concepts of the variable delay circuit. Various other embodiments are contemplated with more or fewer components and may have different configurations.

Figure 4:
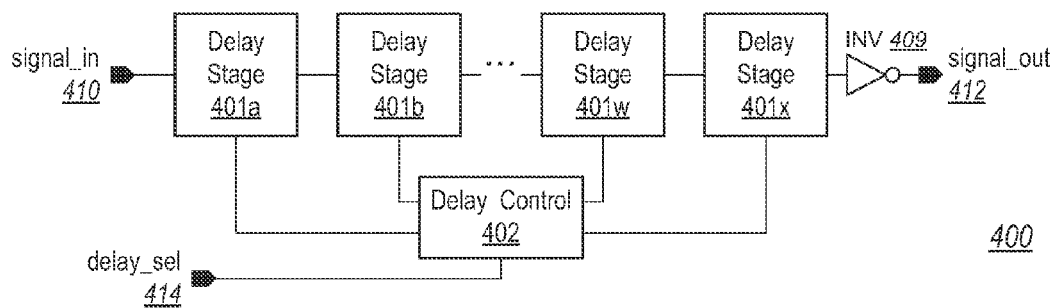
FIG. 4 illustrates a block diagram of a variable delay circuit.

Turning now to FIG. 4, a block diagram of an embodiment of an variable delay circuit is illustrated. Variable delay circuit 400 may correspond to variable delay circuit 203 in FIG. 2 or variable delay circuit 307 in FIG. 3. Variable delay circuit 400 may include multiple delay stages, delay stages 401a through 401x coupled in series with the last stage coupled to inverter (INV) 409. A delay stage may also be referred to as a delay unit. Each stage may also be coupled to delay control 402. Variable delay circuit 400 may receive signal_in 410 and delay_sel 414 as inputs and generate signal_out 412.

Variable delay circuit 400 may include any suitable number of delay stages 401. Each stage may include two delay paths, each delay path delaying propagation of signal_in 410 by a respective delay time. One of the two delay paths may be selected dependent on a control signal received from delay control 402. In some embodiments, a first delay path of each delay stage 401 may delay propagation of signal_in 410 for a minimum first delay time which may correspond to a time for propagating signals through a switching or multiplexing circuit included in the stage. A second delay path may provide a larger amount of delay than the first delay path and the amount of delay of the second delay path may be generated by propagating signal_in 410 through one or more delay elements such as inverters.

It is noted that many delay elements are known and contemplated for use in variable delay circuit 400. For example, in addition to a traditional inverter, transmission gates, cascaded inverters, voltage-controlled inverters, current-starved inverters, differential amplifier delay cells, inverters with Schmitt triggers, etc., may be used as delay elements. For simplicity and clarity, inverters may be used as delay elements for the purposes of disclosure.

In some embodiments, the second delay path for each of the delay stages 401 may be substantially the same, such that a total maximum delay time through delay stages 401 may be $X*t$, where X is the total number of delay stages and t is the delay time for a single stage. In other embodiments, each of the second delay times may be different. For example, the second delay paths may be designed for a binary progression such that the second delay time for delay stage 401a may be t, the second delay time for delay stage 401b may be $2*t$, up to the second delay time for delay stage 401x which may be $2^{(X-1)}*t$. In such an embodiment, the total maximum delay time through all delay stages 401a through 401x may be approximately $2^{X}*t-t$.

A selected delay time for variable delay circuit 400 may be determined by a value, delay_sel 414, sent to delay control 402. Delay control 402 may determine which path of each delay stage 401 to select based on the value of delay_sel 414. Delay_sel 414 may be sent to delay control 402 from another circuit, such as frequency compare unit 205 in FIG. 2 or clock recovery 305 in FIG. 3.

It is noted that FIG. 4 is merely an example for demonstration purposes. In other embodiments, functional blocks may be configured differently. Various other embodiments may include a different number of functional blocks. For example, inverter 409 may not be included in some embodiments.

Figure 5:
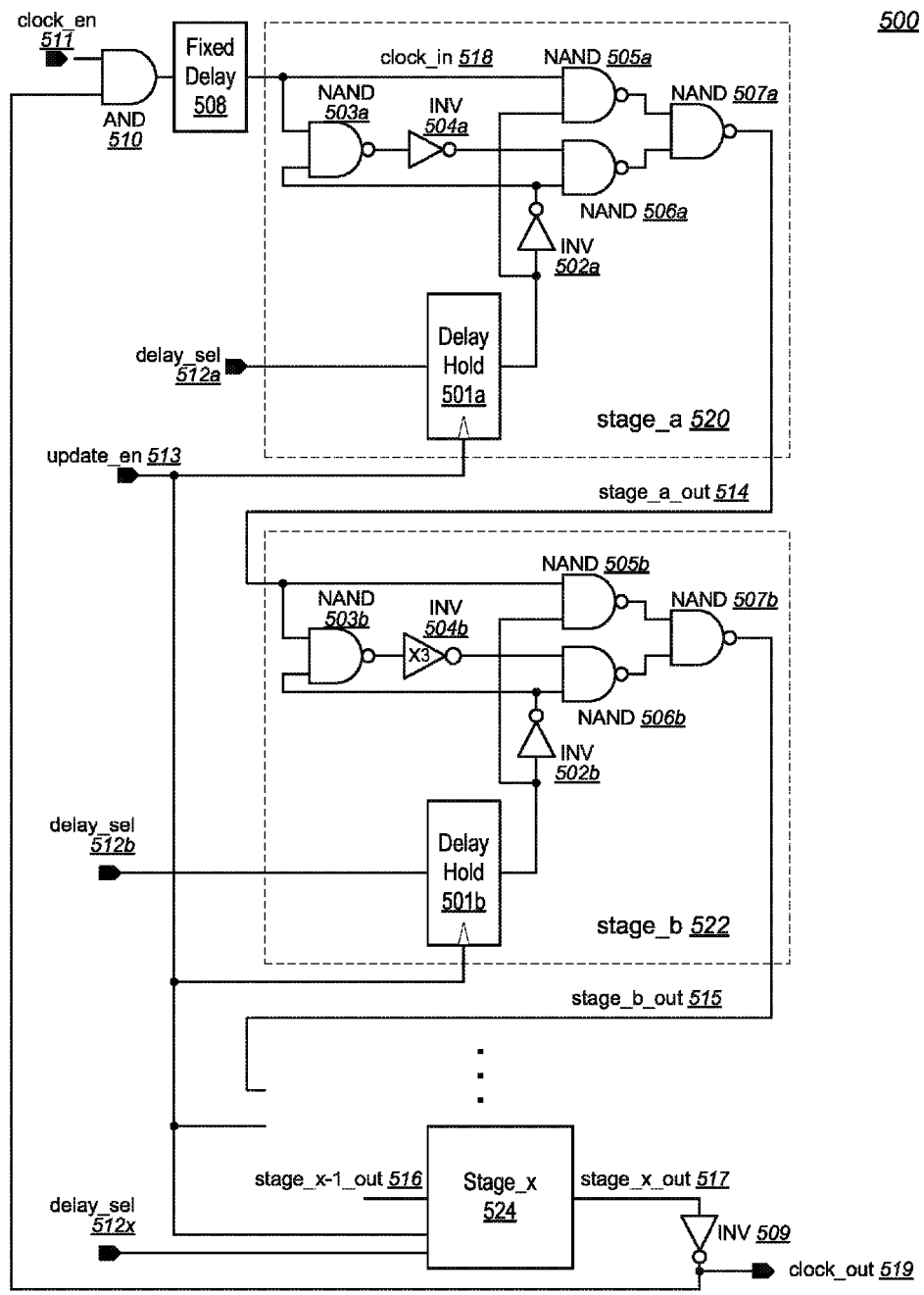
FIG. 5 illustrates a diagram of a ring oscillator circuit.

Moving now to FIG. 5, a diagram of a ring oscillator circuit is illustrated. Ring oscillator circuit 500 may correspond to at least a portion of ring oscillator 200 in FIG. 2. Ring oscillator circuit 500 may include AND gate 510, fixed delay circuit 508 and multiple delay stages, including stage_a 520, stage_b 522 up to stage_X 524. For clarity, not all delay stages are shown and details of the stages are shown only for stage_a 520 and stage_b 522. Stage_a 520 may include NAND gates 503a and 505a. Delay hold circuit 501a may be coupled to inverter (INV) 502a and to NAND gate 505a. NAND gate 506a may be coupled INV 502a, INV 504a, and NAND 507A. Stage_a 520 may be coupled to stage_b 522 which may have a similar structure as stage_a 520.

AND gate 510 may be used to enable and disable a clock output, clock_out 519, of ring oscillator 500, dependent on clock_en 511. When clock_en 511 is low, then the output of AND gate 510 may also be low and the output of ring oscillator 500, i.e., clock_out 519, may remain high. When clock_en 511 transitions high, then clock_in 518 may depend on the value of clock_out 519 and may therefore transition high after a predetermined delay time through fixed delay 508. In other embodiments, fixed delay 508 may be included as a part of AND gate 510 rather than as a separate block.

Each delay stage may include one of two delay paths, as described above for variable delay circuit 400. In stage_a 520, a first delay path may be through NAND gate 505*a* while a longer second delay path may be through NAND gates 503*a* and 506*a*, including INV 504*a*. Delay_sel 512*a* may be a control signal for stage_a 520 used to select which of the two delay paths are taken through stage_520. Delay_sel 512*a* may be received by delay hold circuit 501*a*, which may latch a value of delay_sel 512*a* on an active transition of update_en 513, and use this latched value to select the indicated delay path. In various embodiments, the active transition of update_en 513 may be a low-to-high transition, a high-to-low transition or any transition.

In the illustrated embodiment, a high value from delay hold circuit 501 a may enable the first delay path through NAND gate 505*a* to NAND gate 507*a*. The output of INV 502*a* may be low due to this high value from delay hold circuit 501*a*. This low value may result in outputs of NAND gates 503*a* and 506*a* in the second delay path to remain high while the first delay path is selected. It is noted that the inclusion of NAND gate 503*a* may reduce power consumed in the second delay path while the first delay path is selected, as well as result in the output of INV 504*a* remaining low during this time.

In contrast to a high value, a low value from delay hold circuit 501*a* may enable the second delay path and result in the output of NAND gate 505*a* remaining high while the second delay path is selected. INV 502*a* may output a high, enabling NAND gate 503*a* and NAND gate 506*a* to propagate clock_in 518. INV 504*a* may be designed to add a predetermined propagation delay time between the output of NAND gate 503*a* and the input of NAND gate 506*a*. In some embodiments, this delay time may be designed to be much larger than propagation delay times though the other gates in stage_a 520 such as NAND gate 503*a* and NAND gate 506*a*. In other embodiments, the delay time through INV 504*a* may be substantially the same as delay times through the other gates in stage 520. It is noted that although INV 504*a* is shown to be an inverter in the present embodiment, INV 504*a* may be replaced with any suitable delay element in other embodiments.

As previously stated, the outputs of both NAND gate 505*a* and NAND gate 506*a* may be high when their corresponding delay path is not selected. As a result, NAND 507*a* may be enabled to pass input signals propagating through the selected delay path. It is noted that each NAND gate and inverter may invert a signal at its respective input. Stage_a 520 may be designed such that through both the first delay path and the second delay path, an even number of inverting gates are included, resulting in an output of stage_a 520, i.e., stage_a_out 514, maintaining a same polarity as the input to stage_a 520. In other words, a low-to-high transition on the input to stage_a 520 will result in a low-to-high transition on stage_a_out 514 after the selected delay time elapses.

Stage_a_out 514 may be received as the input to stage_b 522. In some embodiments, stage_b 522 may be substantially the same as stage_a 520. In other embodiments, stage_b 522 may be similar to stage_a 520, with one or more design differences. In the illustrated embodiment, stage_b 522 may be designed the same as stage_a 520 with the exception of INV 504*b*. INV 504*b* may be designed to have a longer delay time compared to INV 504*a*. In the present embodiment, INV 504*b* may have a delay time that is three times longer than the delay time of INV 504*a*. Subsequent delay stages, such as a stage_c (not shown), may include a delay inverter, INV 504*c* (not shown), with a delay time seven times longer than the delay time of INV 504*a*, and further delay stages may include delay paths through inverters with ever increasing delay times. Although INV 504*b* is illustrated as a single inverter, INV 504*b* may consist of multiple delay elements arranged to provide the desired delay time. For example, to achieve a desired delay time of three times the delay time of INV 504*a*, INV 504*b* may consist of three circuits equivalent to one circuit of INV 504*a*, arranged in series. Other delay circuits are known and contemplated.

Ring oscillator 500 may include any suitable number of delay stages up to stage_x 524. An output of each stage may be coupled to an input of a subsequent stage, thereby creating a delay circuit with a total delay time equal to the sum of the delay time through each stage. The output of the final delay stage, stage_x_out 517, may be coupled to INV 509. Since, as previously stated, each delay stage may not invert the polarity of its input signal, INV 509 may be used to invert the signal seen at the input of the first delay stage, stage_a 520, to generate the ring oscillator output signal, i.e., clock_out 519. Clock_out 519 may be used as feedback input into AND gate 510. Since clock_out 519 is the opposite polarity of the original input into stage_a 520, clock_out 519 will transition to the opposite value after the total selected delay time period elapses. This transition of clock_out 519 may be feedback through AND gate 510 and then propagate back to clock_in 518, creating a new transition that will propagate through the delay stages for the selected delay time period, thereby resulting in another transition of clock_out 519. This process may continue while clock_en 511 is high, generating a clock signal on clock_out 519 with a period that is twice as long as the total selected delay time. This clock period may be adjusted by selecting one or more new values for delay_sel 512*a* through 512*x*.

It is noted that FIG. 5 is merely an example for demonstrating a possible use for a variable delay circuit. In other embodiments, functional blocks may be configured differently. Various other embodiments may include a different number and/or type of functional blocks. For example, circuits are contemplated with the NAND gates in the illustrated embodiment replaced with other combinational logic gates, such as, for example, NOR gates or OR gates.

Figure 6:
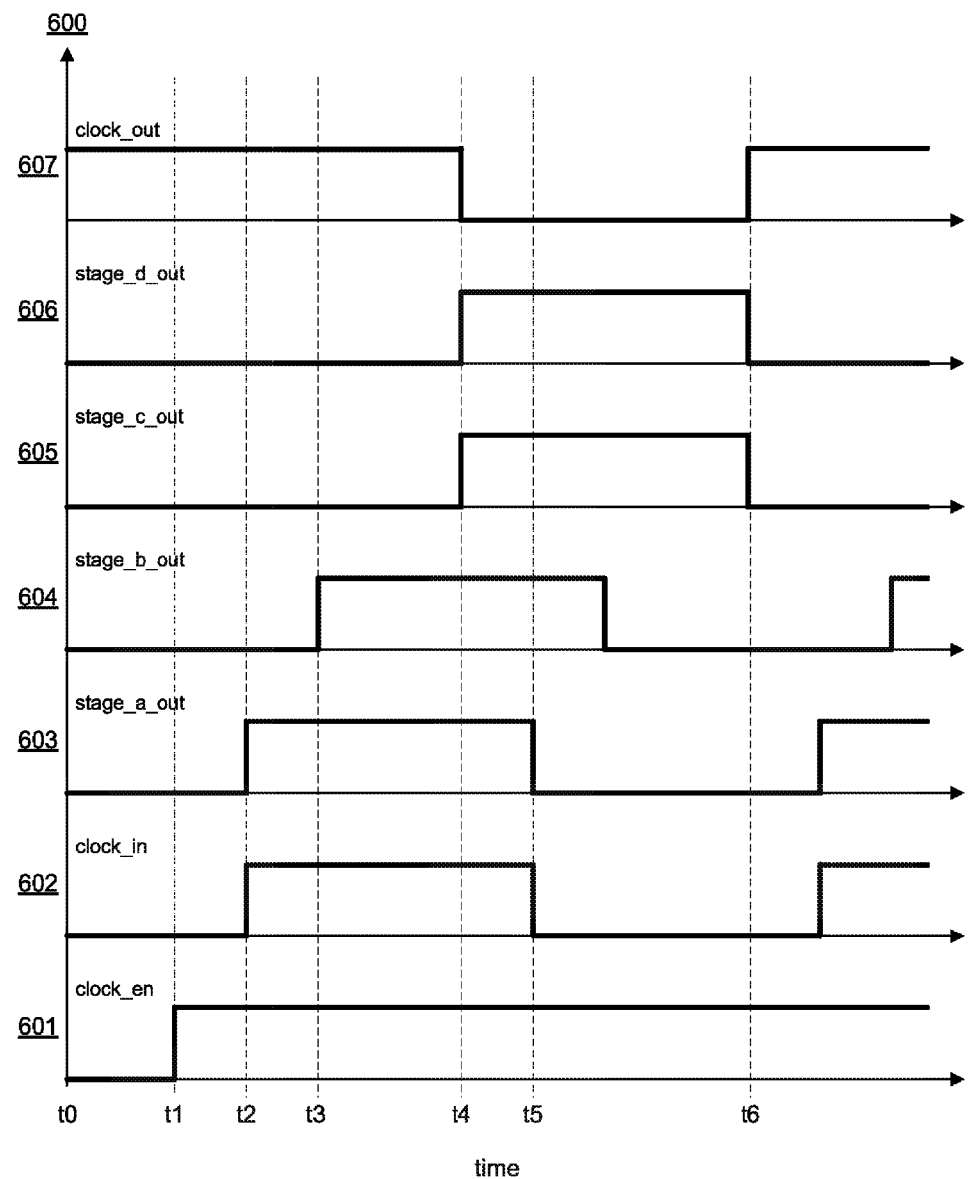
FIG. 6 illustrates a chart of possible waveforms of an embodiment of a variable delay circuit for a given delay time.

Turning to FIG. 6, a chart of possible waveforms of an embodiment of a variable delay circuit for a given delay time is illustrated. The waveforms of chart 600 may correspond to operations of a ring oscillator, such as, e.g., ring oscillator 500 in FIG. 5 and may illustrate logic levels of signals versus time. For the present embodiment, a ring oscillator including a variable delay circuit with four delay stages, shown in chart 600 as stage_a through stage_d, is presented. Chart 600 includes possible examples of waveforms for clock_en 601, clock_in 602, stage_a_out 603, stage_b_out 604, stage_c_out 605, stage_d_out 606 and clock_out 607. These waveforms may correspond to a similarly named signal in FIG. 5. Referring collectively to ring oscillator 500 of FIG. 5 and chart 600 of FIG. 6, the waveforms may begin at time t0.

For this example embodiment, delay stages stage_a and stage_d may be set to use their respective shorter first delay paths. In other words, delay_sel 512*a* and delay_sel 512*d* may both be high. Delay stages stage_b and stage_c may be set to use their respective slower second delay paths, i.e., delay_sel 512*b* and delay_sel 512*c* may both be low. In the illustrated example, the first delay paths are shown to have close to zero delay, while each second delay path is shown to have a delay approximately twice as long as the previous stage, with stage_d having the longest second delay path and stage_a having the shortest second delay path.

At time t0, clock_en 601 is low, which may result in clock_in, as well as the output of each delay stage, stage_a_out 603 through stage_d_out 606, to also be low. Clock_out 607 may be high due to INV 509 inverting the output of the final stage (stage_d_out 606 in the present embodiment, corresponding to stage_x_out 517 in FIG. 5).

At time t1, clock_en 601 may transition high. The output of AND gate 510 may transition high in response to both inputs being high. Due to fixed delay circuit 508, all delay stage outputs may remain low and therefore, clock out 607 may remain high. At time t2, the output of AND gate 510 may propagate through fixed delay circuit 508, resulting in clock_in 602 transitioning high. Since as stated above, stage_a may be set for a first delay path with approximately zero delay time, stage_a_out 603 may also transition high. Stage_b is set to use the second delay path, so stage_b_out 604 and subsequent delay stage outputs may remain low.

Stage_b_out 604 may transition high after the stage_b delay time elapses at time t3. Stage_c is also set for its respective second delay path, so stage_c_out 605 and stage_d_out 606 may remain low. Clock_out 607, therefore, remains high. The stage_c delay time may elapse at time t4 and stage_c_out may then transition high. Stage_d_out 606 may also transition high since it is set for the first delay path (i.e., approximately zero delay time). INV 509 may invert stage_d_out 606 resulting in clock_out 607 transitioning low. Since clock_out 607 is fed back into the input of AND gate 510, the low transition on clock_out 607 may be received at the input of fixed delay circuit 508. At time t5, the low transition on clock_out 607 may propagate through fixed delay circuit 508, resulting in clock_in 602 transitioning low. The low transition on clock_in 602 may propagate back through delay stage_a through stage_d again, as just described, resulting in clock out 607 transitioning high after the total selected delay time. The pattern may continue to repeat while clock_en 601 is high.

It is noted that chart 600 of FIG. 6 merely illustrates examples of waveforms that may result from an embodiment presented in this disclosure. The waveforms are simplified to provide clear descriptions of the disclosed concepts. In other embodiments, the waveforms may appear different due various influences such as technology choices for building the circuits, actual circuit design and layout, ambient noise in the environment, choice of power supplies, etc. It is also noted that transitions through AND gate 510, the first delay paths of stage_a and stage_d, and INV 509 are illustrated to have approximately zero delay times. In other embodiments, these circuit components may have non-zero delay times that may add to the period of clock_out 607.

Figure 7:
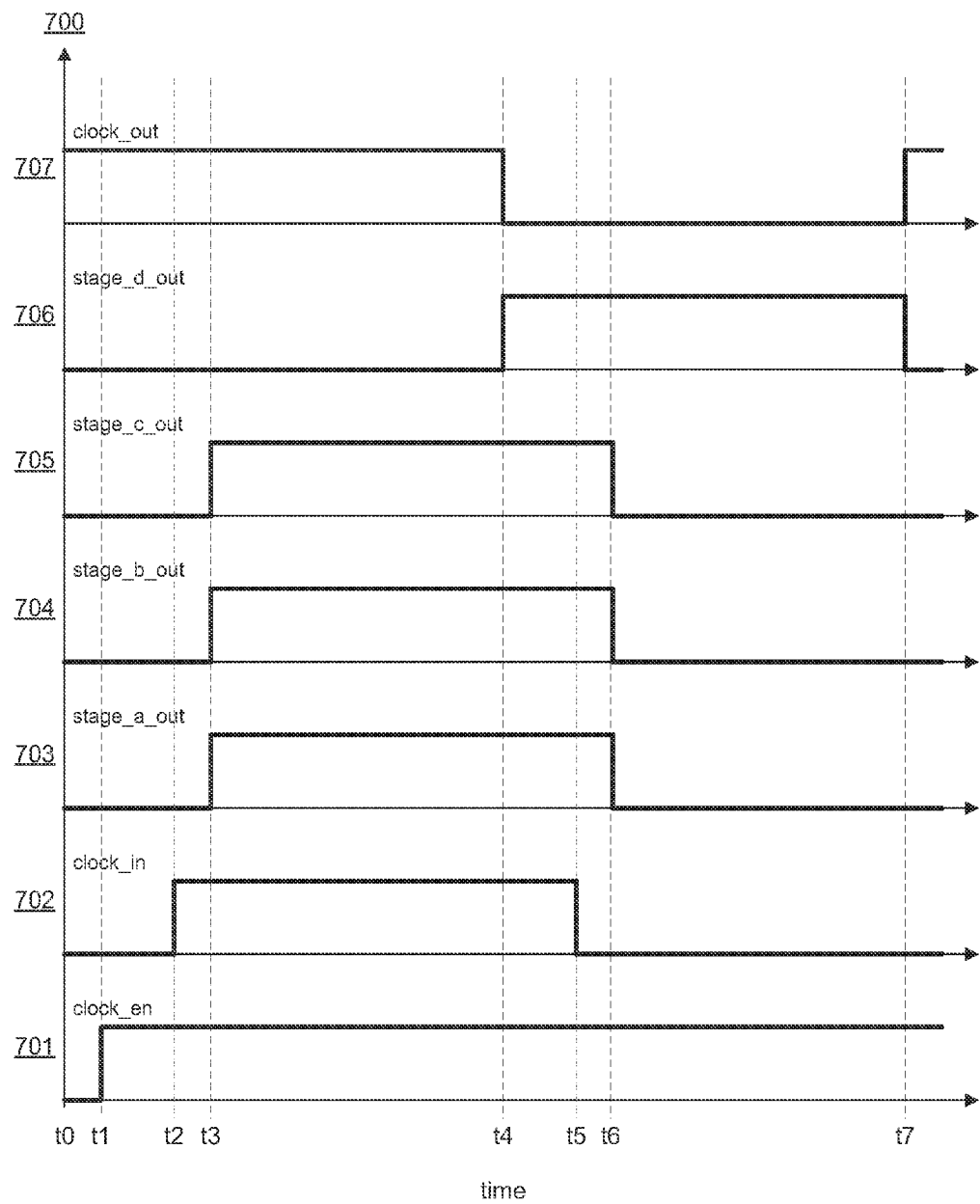
FIG. 7 illustrates a chart of possible waveforms of an embodiment of a variable delay circuit for a different delay time.

Moving to FIG. 7, a chart of possible waveforms of the same embodiment of a variable delay circuit for a different delay time is illustrated. The waveforms of chart 700 may again correspond to operations of a ring oscillator, such as, e.g., ring oscillator 500 in FIG. 5 and may again illustrate logic levels of signals versus time. For the present embodiment, a ring oscillator including a variable delay circuit with four delay stages, shown in chart 700 as stage_a through stage_d, is presented. Chart 700, similar to chart 600 in FIG. 6, includes possible examples of waveforms for clock_en 701, clock_in 702, stage_a_out 703, stage_b_out 704, stage_c_out 705, stage_d_out 706 and clock_out 707. These waveforms may correspond to similarly named signals in FIG. 5. Referring collectively to ring oscillator 500 of FIG. 5 and chart 700 of FIG. 7, the waveforms may begin at time t0.

For this example embodiment, delay stages stage_a and stage_d may be set to use their respective longer second delay paths. In other words, delay_sel 512a and delay_sel 512d may both be low. Delay stages stage_b and stage_c may be set to use their respective shorter first delay paths, i.e., delay_sel 512b and delay_sel 512c may both be high. As described in regards to FIG. 6, in the example of FIG. 7, the first delay paths are shown to have close to zero delay, while each second delay path is shown to have a delay approximately twice as long as the previous stage, with stage_d having the longest second delay path and stage_a having the shortest second delay path.

Clock_en 701 may be low at time t0. In response to the low value of clock_en 701, the values of clock_in 702 as well as outputs of the delay stages, stage_a_out 703 through stage_d_out 706, may also be low. Clock_out 707 may be high due to INV 509 inverting the low value of stage_d_out 706. Clock_en 701 may transition high at time t1, resulting in the output of AND gate 510 going high. Clock_in 702, however, may remain low until the transition of the output of AND gate 510 propagates through fixed delay circuit 508, which may occur at time t2. Clock_in 702 may transition high at time t2. Stage_a may delay the transition of clock_in 702, resulting in stage_a_out 703 transitioning high at time t3.

Since stage_b and stage_c are set to use their respective first delay paths with delay times of approximately zero, stage_b_out 704 and stage_c_out 705 may both also transition high at time t3. Stage_d may delay propagating of the high transition from stage_c_out 705 to stage_d_out 706 until time t4. At time t4, stage_d_out 706 may transition high and in response, INV 509 may transition clock_out 707 low. The low transition on clock_out 707 may result in clock_in 702 transitioning low at time t5, after propagating through fixed delay circuit 508. The process may repeat as stage_a_out 703 transitions low after its second delay time elapses, at time t6. Stage_d_out 706 may transition low after its second delay time elapses at time t7, resulting in clock_out 707 transitioning high.

It is noted that chart 700 of FIG. 7 is merely an example of waveforms that may correspond to an embodiment of a ring oscillator. The waveforms are simplified to provide clear descriptions of the disclosed concepts. In other embodiments, the waveforms may appear different due to various influences as described above in regards to FIG. 6. It is also noted again that transitions through AND gate 510, the first delay paths of stage_a and stage_d, and INV 509 are shown to have approximately zero delay times. In other embodiments, these circuit components may have non-zero delay times that may add to the period of clock_out 707.

FIG. 6 and FIG. 7 illustrate how a variable delay circuit, such as described in regards to FIG. 4, may be used to generate a clock signal with an adjustable frequency in a ring oscillator circuit. It is noted that the frequency of such a clock signal may be adjusted without disabling the clock output of the ring oscillator and without introducing any glitches in the clock output signal.

Method for Adjusting a Variable Delay without Causing Glitches

Figure 8:
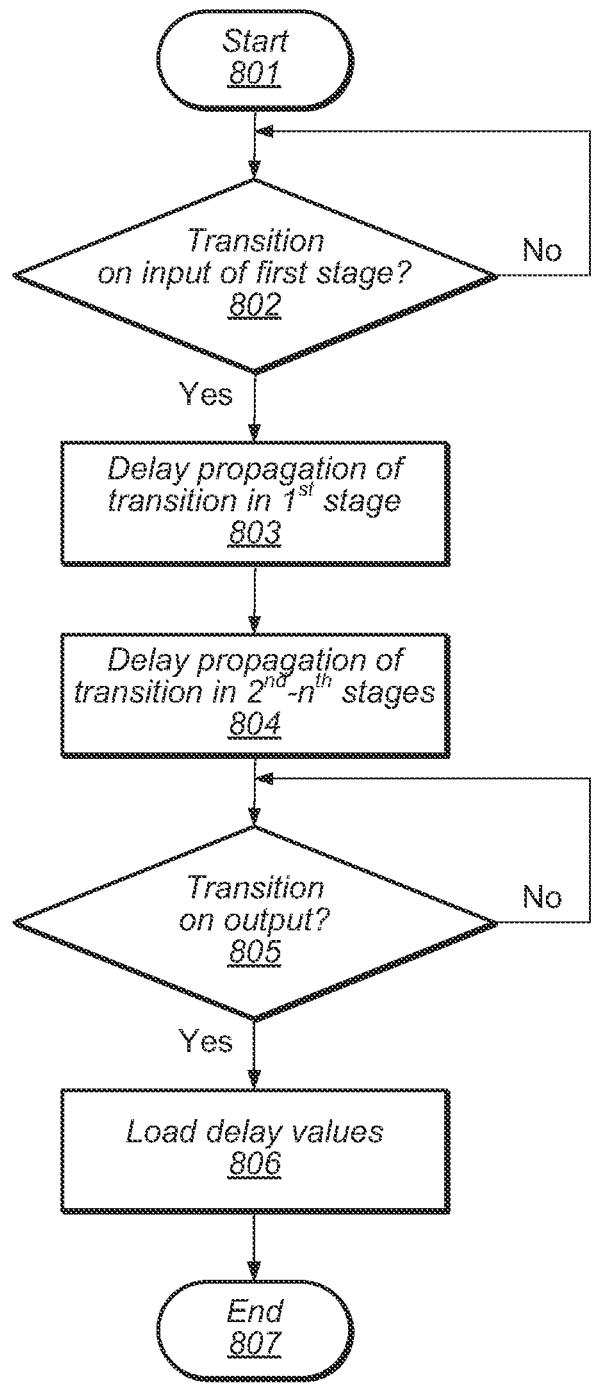
FIG. 8 illustrates a flowchart of an embodiment of a method for adjusting a propagation delay of a signal.

Turning to FIG. 8, a flowchart of an embodiment of a method for adjusting a propagation delay of a signal is illustrated. The method may be applied to a system which includes a variable delay circuit, such as, for example, ring oscillator 500 in FIG. 5. Referring collectively to ring oscillator 500 in FIG. 5 and the flowchart in FIG. 8, the method may begin in block 801.

The method may depend on a transition of an input signal (block 802). A first stage of a variable delay circuit, such as stage_a 520 in ring oscillator 500, may wait for a transition of an input signal, such as clock_in 518. If a transition occurs, then the method may move to block 803 to delay a propagation of the transition. Otherwise, the method may remain in block 802.

Once a transition is received on clock_in 518, then the transition may be delayed before transitioning an output of stage_a 520 (block 803). Stage_a 520 may include two delay paths, a first path with a first delay time and a second delay path with a second delay time which may be longer than the first delay time. One of the two delay paths may be selected dependent upon a control signal such as delay_sel 512a. For example, the first path may be currently selected and the transition on clock_in 518 may be delayed for the first delay time. When the first delay time elapses since receiving the transition, the output of stage_a 520, i.e., stage_a_out 514 may transition.

In response to stage_a_out 514 transitioning, a next delay stage may receive the transition and delay its propagation for a selected delay time (block 804). Any suitable number of delay stages may be included in ring oscillator 500 and each successive stage may receive a transition from the previous delay stage and then delay that transition for a selected delay time. Revisiting the embodiment of FIG. 6, for example, four delay stages may be included in which the first delay time for each stage is approximately zero and the second delay time may be t for stage_a 520, 2t for stage_b 522, 4t for stage_c (not illustrated in FIG. 5) and 8t for stage_d (i.e., stage_x 524 in FIG. 5). As previously stated, for the embodiment of FIG. 6 stage_a 520 and stage_d may be set to select the first delay paths and stage_b 522 and stage_c may be set to select the second delay paths dependent on a values of delay_sel 512a through delay_sel 512d (corresponding to delay_sel 512x in FIG. 5). This may result in the waveforms as shown in FIG. 6, with clock_out 519 having a first clock period.

The method may now depend on a transition of an output of the variable delay circuit, such as clock_out 519 (block 805). The output of the final stage, such as stage_x_out 517 (corresponding to the output of stage_d) may be inverted by INV 509, to produce clock_out 519. In other embodiments, the output may be inverted within the final delay stage and INV 509 may not be necessary. If clock_out 519 transitions, then the method may move to block 806 to update the delay time settings. Otherwise, the method may remain in block 805 until clock_out 519 transitions.

In response to the transition of clock_out 519, values for delay_sel 512a through delay_sel 512x may be received (block 806). The values for delay_sel 512a through delay_sel 512x may be received from a circuit such as, for example, frequency compare unit 205 in FIG. 2 or clock recovery 305 in FIG. 3. Values of delay_sel 512a-512x may be held in delay hold circuits 501a-501x. Delay hold circuits 501a-501x may sample their respective inputs of delay_sel 512a-512x in response to an active transition on update_en 513. In some embodiments, the active transition on update_en 513 may correspond to a falling transition of clock_out 519, while in other embodiments, the active transition on update_en 513 may correspond to a rising transition of clock_out 519. In still other embodiments, additional logic may be included such that several transitions of clock_out 519 are bypassed. For example, logic may be included in which the active transition on update_en 513 may correspond to every fourth rising transition of clock_out 519, or every eighth falling transition of clock_out 519. In the present embodiment, the active transition on update_en 513 may correspond to a rising transition of clock_out 519.

It is noted that upon a rising transition of clock_out 519, the output of each delay stage may be low, as shown at time t6 in FIG. 6 or at time t7 in FIG. 7. Referring back to FIG. 5, an output of a stage, such as stage_a 520 is low when both inputs to NAND gate 507a are high. In other words, both the first and second delay paths (i.e., the outputs of NAND gate 505a and NAND gate 506a, respectively) are high. Updating the value held in delay hold circuit 501a at this point may avoid generating an unwanted glitch if the selected delay path is switched. In other embodiments, the logic circuits may be designed in which both delay stages are low rather than high.

In some embodiments, update_en 513 may only transition in response to an active transition on clock_out 519 if a determination has been made that one or more values of delay_sel 512a-512x have changed since the last active transition. In other embodiment, values of delay_sel 512a-512x may be sampled by delay hold circuits 501a-501x in response to an active transition on clock_out 519 regardless if any values of delay_sel 512a-512x have changed. Once the active transition of update_en 513 occurs, the method may end in block 807.

It is noted that the method illustrated in FIG. 8 is merely an example embodiment. Variations on this method are possible. Some operations may be performed in a different sequence, and/or additional operations may be included.

Numerous variations and modifications will become apparent to those skilled in the art once the above disclosure is fully appreciated. It is intended that the following claims be interpreted to embrace all such variations and modifications.

What is claimed is:

1. An apparatus, comprising:
  a first delay unit configured to:
    delay propagation of a signal by a first delay time, via a first delay path, responsive to a first value of a first control signal; and
    delay propagation of the signal by a second delay time, via a second delay path, responsive to a second value of the first control signal;
  a second delay unit configured to:
    delay propagation of an output of the first delay unit by a third delay time, via a third delay path, responsive to a first value of a second control signal; and
    delay propagation of the output of the first delay unit by a fourth delay time, via a fourth delay path, responsive to a second value of the second control signal; and
  circuitry configured to:
    change the first control signal from the second value to the first value responsive to a determination that the output of the first delay unit and an output of the second delay unit are both a same logic value, wherein the output of the second delay path remains at a constant logic value when the first value of the first control signal is selected.

2. The apparatus of claim 1, wherein the signal is a clock signal.

3. The apparatus of claim 2, wherein the circuitry is further configured to change the first control signal from the second value to the first value while the clock signal is active.

4. The apparatus of claim 3, wherein the circuitry is further configured to change the first control signal from the second value to the first value responsive to a transition of the clock signal.

5. The apparatus of claim 1, wherein a value of the first delay time is less than a value of the second delay time.

6. The apparatus of claim 1, wherein a value of the first delay time is substantially the same as a value of the third delay time.

7. A method, comprising:
  delaying propagation of a signal through a first delay stage, wherein the first delay stage includes a first delay path with a first delay time and a second delay path with a second delay time;
  delaying propagation of an output of the first delay stage through a second delay stage, wherein the second delay stage includes a third delay path with a third delay time and a fourth delay path with a fourth delay time, and wherein a value of the fourth delay time is greater than a value of the second delay time; and
  changing the first delay stage from the second delay path to the first delay path responsive to a determination that the output of the first delay stage and an output of the second delay stage are both a same logic value, wherein an output of the second delay path remains at a constant logic value when the first delay path is selected.

8. The method of claim 7, wherein the signal is a clock signal.

9. The method of claim 8, further comprising selecting the first delay path of the first delay stage while the clock signal is active.

10. The method of claim 9, further comprising changing the first delay stage from the second delay path to the first delay path responsive to a transition of the clock signal.

11. The method of claim 7, wherein a value of the first delay time is less than the value of the second delay time.

12. The method of claim 7, wherein a value of the first delay time is substantially the same as a value of the third delay time.

13. A system, comprising:
  a first circuit configured to generate a first signal on an output node;
  a second circuit configured to receive a second signal on an input node; and
  a delay circuit coupled to the output node and to the input node, wherein the delay circuit is configured to:
    delay propagation of the first signal through a first delay stage, wherein the first delay stage includes a first delay path with a first delay time and a second delay path with a second delay time;
    delay propagation of an output of the first delay stage through a second delay stage, wherein the second delay stage includes a third delay path with a third delay time and a fourth delay path with a fourth delay time, and wherein a value of the fourth delay time is greater than a value of the second delay time;
    change the first delay stage from the second delay path to the first delay path responsive to a determination that the output of the first delay stage and an output of the second delay stage are both a same logic value, wherein an output of the second delay path remains at a constant logic value when the first delay path is selected; and
    generate the second signal dependent upon the output of the second delay stage.

14. The system of claim 13, wherein the first signal is a clock signal.

15. The system of claim 14, wherein the delay circuit is further configured to select the first delay path of the first delay stage while the clock signal is active.

16. The system of claim 15, wherein the delay circuit is further configured to change the first delay stage from the second delay path to the first delay path responsive to a transition of the clock signal.

17. The system of claim 13, wherein a value of the first delay time is less than the value of the second delay time.

18. The system of claim 13, wherein a value of the first delay time is substantially the same as a value of the third delay time.

\* \* \* \* \*